United States Patent

Arikado et al.

[11] Patent Number: 6,099,681
[45] Date of Patent: Aug. 8, 2000

[54] MOUNTING APPARATUS FOR MOUNTING SMALL BALLS AND MOUNTING METHOD THEREOF

[75] Inventors: Kazuo Arikado; Shinichi Nakazato, both of Fukuoka, Japan

[73] Assignee: Matsushita Electric Industrial Co., Ltd., Osaka, Japan

[21] Appl. No.: 09/131,819

[22] Filed: Aug. 10, 1998

[30] Foreign Application Priority Data

Aug. 8, 1997 [JP] Japan .................................. 9-214282

[51] Int. Cl.⁷ ..................................................... B32B 31/00
[52] U.S. Cl. .......................... 156/285; 156/292; 156/382; 269/21
[58] Field of Search ............................. 156/99, 285, 382, 156/292; 228/175; 269/21

[56] References Cited

U.S. PATENT DOCUMENTS 5,558,732   9/1996   Hamon ........................................ 156/99

Primary Examiner—Francis J. Lorin
Attorney, Agent, or Firm—Ratner & Prestia

[57] ABSTRACT

When applying a flux 2 kept in a container 16 onto a conductive ball 1, the flux 2 is first applied by a squeegee unit 17 on a bottom 16a of container 16 in the form of layer having a certain predetermined layer thickness. Then, a suction head 20 holding a solder ball 1 is lowered towards the container 16. As soon as a touch sensor 43 detects a touching of the solder ball 1 to the bottom 16a, the suction head 20 is lifted, and the solder ball 1 held to the suction head 20 is transferred onto a workpiece. Thus a solder ball 1 may be transferred onto a workpiece after being applied with a certain specific amount of flux 2 with precision.

6 Claims, 6 Drawing Sheets

MOUNTING APPARATUS FOR MOUNTING SMALL BALLS AND MOUNTING METHOD THEREOF

BACKGROUND OF THE INVENTION

The present invention relates to a mounting apparatus for applying a flux or other adhesive substance onto small balls, such as solder balls, and mounting these to an electronic component or such other workpiece, as well as a method thereof.

When forming a bump on an electrode of a workpiece, to which an electronic component is to be mounted, a solder ball or other small ball is often employed. Namely, a solder ball is placed on an electrode of workpiece, and then the workpiece is heated to have the solder ball soldered on the electrode; a bump is thus formed. In order to ensure the soldering between solder ball and electrode, a flux is normally employed. The flux has to be applied on either the solder ball or the electrode, before the solder ball is placed on the electrode.

For applying flux, a suction head holding solder balls by a vacuum is lowered to the surface of flux kept in a boat until the lower end of solder ball touches on the surface of flux. A small amount of flux is thus transferred to the small ball. The flux is applied only no the tip end of the small ball by controlling the lowering stroke of the suction head.

As the diameter of solder balls getting smaller, a precise control of stroke is required when lowering the suction head. In the above described application procedure, however, a trivial error in the input control data readily results in a wide dispersion in the quantity of flux application, or insufficiency is caused in the quantity of flux application on the solder ball.

Similar problems likewise arise when applying a solder paste conductive glue on a conductive ball of copper, gold, etc. before mounting the ball to a workpiece.

SUMMARY OF THE INVENTION

The present invention provides a mounting apparatus for applying with precision a certain predetermined amount of adhesive substance onto small balls held to a suction tool by a vacuum, and mounting the balls to a workpiece. The present invention also provides a mounting method therefor.

An invented apparatus for mounting small balls to a workpiece comprises a suction head having a plurality of suction holes disposed in a certain specific arrangement for holding the small balls each at the respective holes by a vacuum, a flat plane, layer forming means for forming a layer of adhesive substance on the plane with a certain specific layer thickness, lowering/lifting means for lowering/lifting the suction head holding the small balls by a vacuum towards the layer of adhesive substance formed on the plane in order to have the small balls applied with the adhesive substance, and touch detection means for detecting a touching of the small balls held to the suction head by a vacuum to said plane during lowering/lifting operation of the suction head driven by the lowering/lifting means.

An invented method of mounting small balls to a workpiece comprises the steps of forming a layer of adhesive substance on the flat plane with a certain predetermined layer thickness, lowering the suction head holding small balls by a vacuum to the layer of adhesive substance in order to have the small balls getting in touch with the adhesive substance, detecting by the touch detection means a touching of the small balls held by the suction head by a vacuum to the plane, and lifting the suction head away from said plane upon detection of a touching by the touch detection means and mounting the small balls applied with adhesive substance to a workpiece.

In the above described constitution, the small balls are once plunged into a layer of adhesive substance formed on a plane with a certain predetermined layer thickness and then lifted after detecting a touch to the plane. Therefore, dispersion in the application quantity of adhesive substance due to errors in the lowering stroke of suction head may be avoidable, and an adhesive substance may be applied onto the small balls surely with precision.

DESCRIPTION OF THE PREFERRED EMBODIMENTS

Now in the following an exemplary embodiment of the present invention is described with reference to the drawings.

Figure 1:
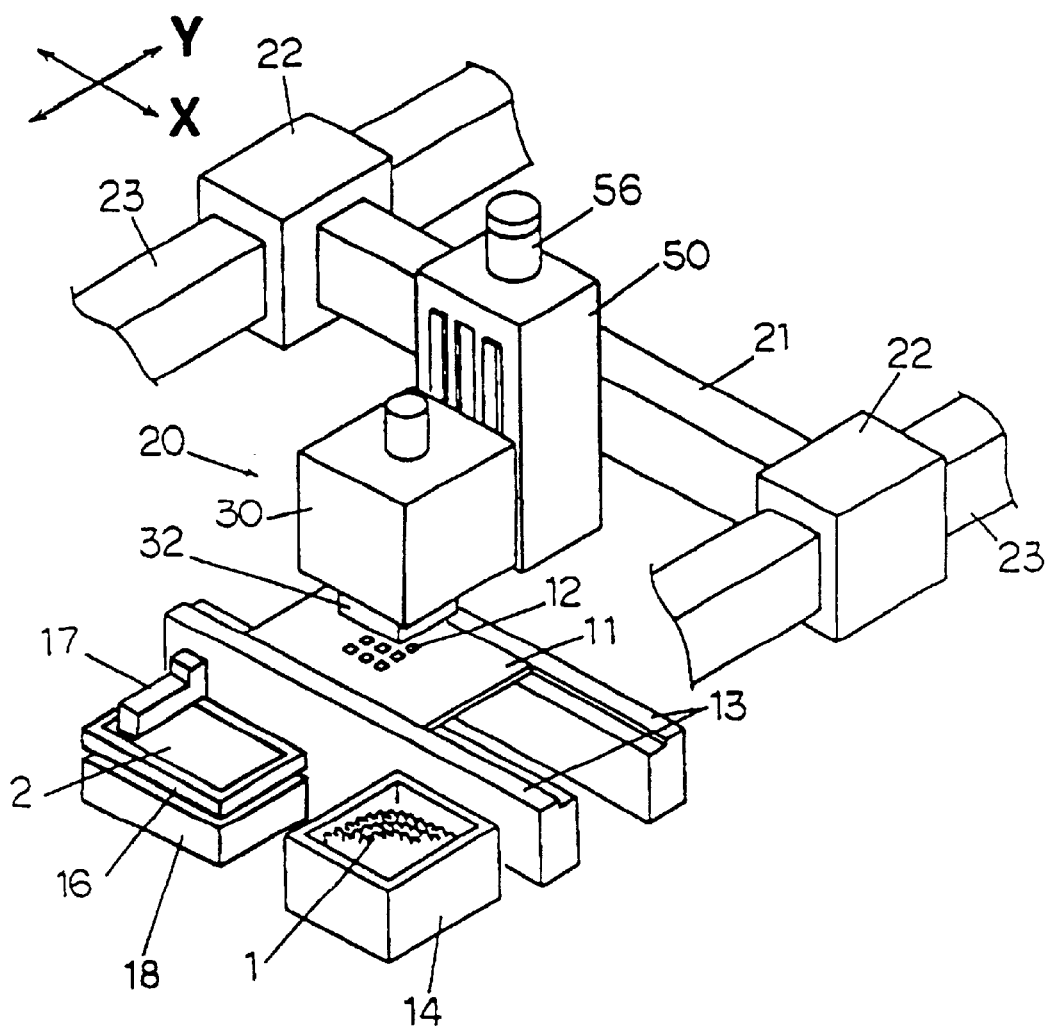
FIG. 1 is a perspective view of a small ball mounting apparatus in accordance with an exemplary embodiment of the present invention.

In FIG. 1, a workpiece 11 such as an electronic component or a circuit board is placed on a guide rail 13. The guide rail 13 is for holding the workpiece 11, clamping it to a specified location. On the surface of workpiece 11 is a plurality of electrodes 12; on which electrode a solder ball 1, or a small ball, is to be mounted. Normally, the size of solder balls range from 50 $\mu$m to 800 $\mu$m. At one side of the guide rail 13, a feeder 14 for feeding the solder balls 1 and a container 16 for reservoiring a flux 2 are provided. A squeegee unit 17 is for flattening the liquid surface of flux 2 in the container 16. Underneath the container 16, a driving mechanism 18 for operating the squeegee unit 17 is provided. The feeder 14 is made of a box, which keeps the solder balls 1 inside.

Above the guide rail 13, a suction head 20 is provided. The suction head 20 can move in the X direction along a driving table 21 which contains a driving mechanism. The driving table 21 is engaged at both ends to a driving table 23 via a slider 22; the driving table 21 moving in the Y direction along the driving table 23. The driving tables 21, 23 constitute transfer means for moving the suction head 20 in the X direction and the Y direction.

Structure of the suction head 20 is described in the following with reference to FIG. 2. An elevation member 30 is shaped without a bottom, and a block 31 is housed therein. A box-shape suction tool 32 is attached to the bottom of block 31. A slider 41 provided at both sides of block 31 is slidably fitted to a vertical rail 42 provided inside the elevation member 30. Accordingly, the suction tool 32 moves sliding in relation to the elevation member 30. At a lower surface of the suction tool 32, a plurality of suction holes 35 are provided in an arrangement corresponding to that of electrodes 12 on workpiece 11. The suction tool 32 is coupled with a suction unit 36 by means of a tube 33. By the operation of suction unit 36, each of the respective suction holes 35 holds a solder ball by a vacuum.

Figure 2:
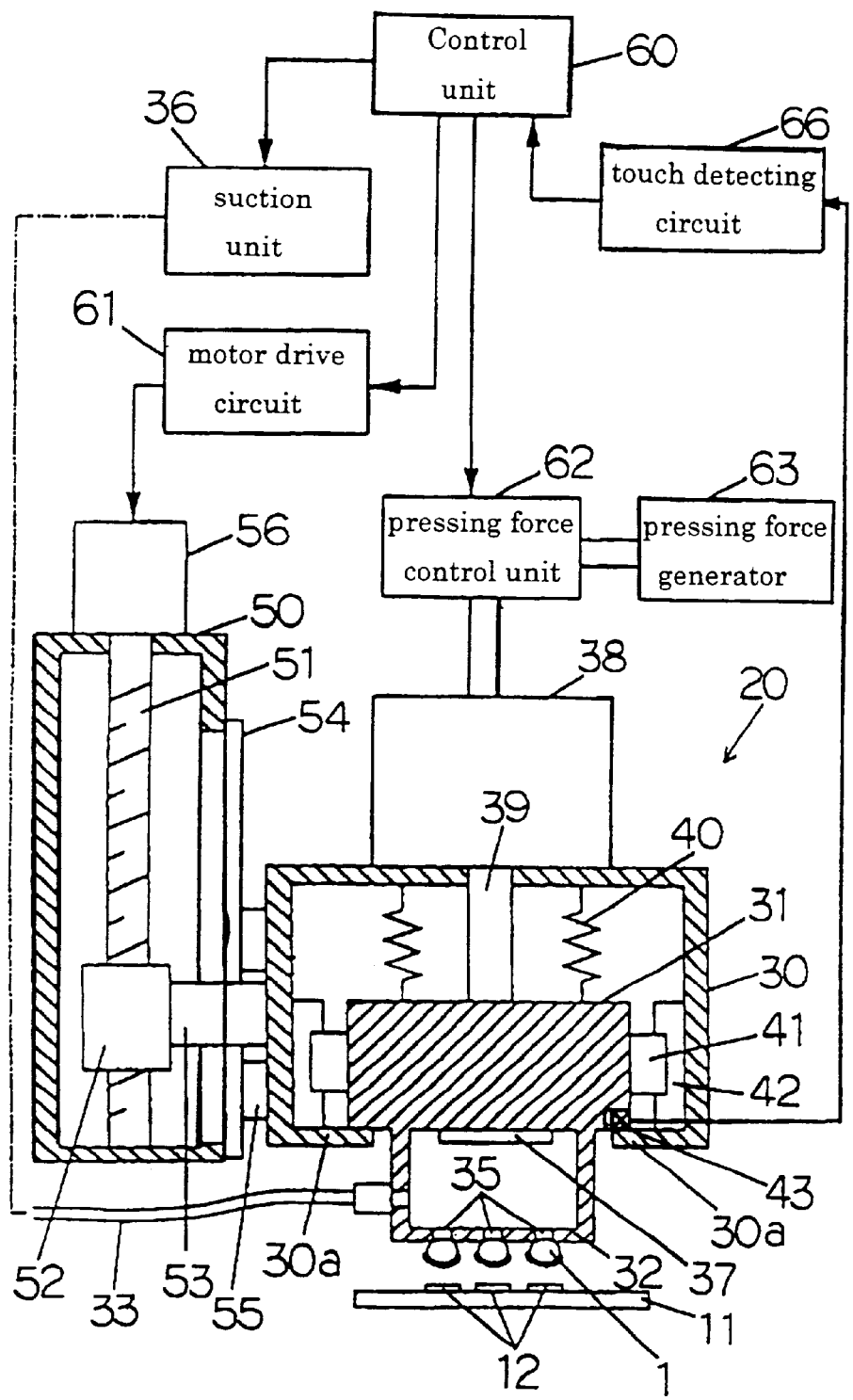
FIG. 2 is a cross sectional view of a suction head in the mounting apparatus of FIG. 1.

Referring to FIG. 2, the block 31 is pressed at an end of the sides onto a bottom board 30a of elevation member 30 for keeping the lower surface of suction tool 32 in parallel with the horizontal plane. Namely, the bottom board 30a not only restricts a lower limit position for the suction tool 32 but it also functions as a stopper for keeping the lower a surface of suction tool 32 horizontal. In the present exemplary embodiment, the block 31 is kept touching at the both sides to the stopper and the parallelism of lower surface of suction tool 32 is maintained with an excellent reproducibility.

A touch sensor 43 is provided at the touching surface formed of block 31 and bottom board 30a. The touch sensor 43 detects discontinuation of the touch contact between the end of side of block 31 and the bottom board 30 a. Surfaces of the above two items are normally kept touching each other, which state is broken as soon as the solder ball 1 held to a lower surface of suction tool 32 gets in touch with a fixed body during the suction head 20 is traveling downward. Namely, by electrically sensing the state of contacting or non-contacting, whether the solder ball 1 is getting into contact with a fixed body is detected. The touch sensor 43 constitutes touch detection means for detecting a touching of the solder ball 1 to a bottom 16a of a container 16 (to be referred to later). As an alternative, a non-contact sensor may be used for detecting a change in relative positioning between the elevation member 30 and the suction tool 32.

Provided on the upper portion of elevation member 30 is a cylinder 38, whose rod 39 is connected at the lower end with the block 31. Ceiling of the elevation member 30 and upper part of the block 31 are connected by a spring member 40. The spring member 40 provides a force for pushing the block 31 in an upward direction, alleviating the self weight in the end of suction tool 32. In the present exemplary embodiment, the spring force of spring member 40 is equivalent to the self weights of block 31 and suction tool 32.

Now in the following, means for moving up and down the elevation member 30 (advance/recess means) is described. At a side of the elevation member 30 is a drive case 50 of vertically oblong shape, and a ball screw 51 is housed vertically inside the case. Engaged with the ball screw 51 is a nut 52, which is connected to the elevation member 30 via a rod 53. At a side of the drive case 50, a rail 54 is provided vertically to slidably support the slider 55 provided at a side of the elevation member 30. When the ball screw 51 is rotated by a motor 56, the nut 52 moves up or down along the ball screw 51. The elevation member 30 as well as the suction tool 32 moves up or down accordingly.

Figure 3:
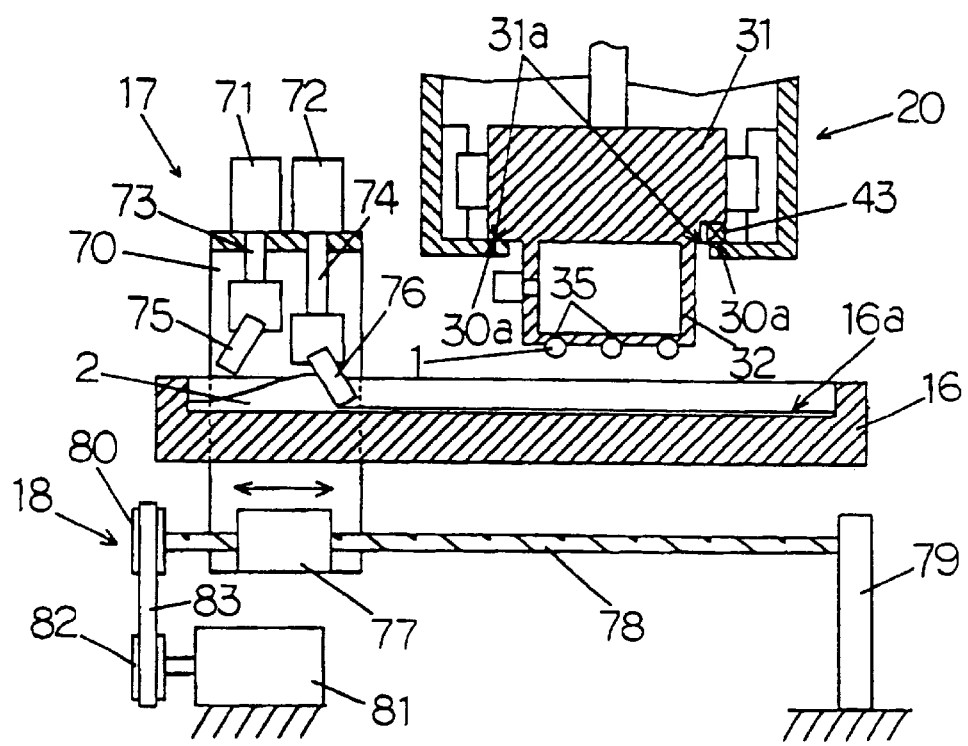
FIG. 3 is a sidewise cross sectional view of a flux reservoir in the mounting apparatus of FIG. 1.

A flux reservoir is described with reference to FIG. 3. In FIG. 3, a container 16 for reservoiring a flux is provided horizontally under the suction head 20. The container 16 has a bottom 16a of a flat plane, the angle of which plane is adjusted to be parallel with the lower surface of suction tool 32 of suction head 20. The bottom 16a is broad enough relative to the lower surface of suction tool 32. A squeegee unit 17 is provided above the container 16. The squeegee unit 17 is moved so that its edge sweeps to and fro on the bottom 16a by a driving mechanism 18 provided underneath the container 16.

The constitution of driving mechanism 18 is described in the following. A bracket 70 of the squeegee unit 17 is connected to a nut 77. The nut 77 is engaged with a transfer screw 78. The transfer screw 78 is supported by a bearing 79, and is provided with a pulley 80. A pulley 82 provided at an end of shaft of a motor 81 is coupled to the pulley 80 of transfer screw 78 by a belt 83. The squeegee unit 17 moves in a horizontal direction to and fro as a result of rotation of the motor 81 in forward and reverse directions.

The squeegee unit 17 is provided with two squeegees 75, 76, which are moved up and down by cylinders 71, 72, respectively. When squeegee unit 17 proceeds forward (towards the right in FIG. 3) the squeegee 75 is lowered, while the squeegee 76 which is tilting in an opposite angle is lowered when the squeegee unit 17 is reversed. The edge of respective squeegees moves in a straight line direction on the bottom 16a of container 16 in a manner as described above, and a flux 2 is spread over the bottom 16a to form a layer of even thickness.

Clearance between the edge of squeegee 75, 76 and the bottom 16a is adjustable by adjusting the protrusion height of rod 73, 74 of the cylinder 71, 72. By so doing, the layer thickness of flux 2 to be formed on the bottom 16a may be controlled to a desired value; for example, to be less than half the radius of a solder ball, which being a preferred value. Thus, the squeegee unit 17 and the driving mechanism 18 constitute layer forming means for forming a layer of a paste or liquid adhesive substance such as flux 2 on the bottom 16a.

In FIG. 2, a control unit 60 controls suction unit 36, motor drive circuit 61, pressing force control unit 62 and others. While the suction, head 20 is lowering towards bottom 16a, the control unit 60 watches a signal from a touch detecting circuit 66 coupled with a touch sensor 43. Upon receiving a signal indicating a touch of solder ball 1 to bottom 16a, the control unit 60 controls the motor 56 by means of a motor drive circuit 61. The motor drive circuit 61 controls the motor 56 in accordance with instruction delivered from the control unit 60. The pressing force control unit 62, which is coupled to a pressing force generator 63, controls the cylinder 38.

A mounting apparatus for mounting conductive balls on a workpiece is structured as described above. The operation of which apparatus is described in the following. Referring to FIG. 1, the suction head 20 comes above the feeder 14. Being driven by motor 56 (ref. FIG. 2) the suction head 20 is lowered to pick up solder ball 1 by a vacuum at the suction hole 35 provided in the lower surface of suction tool 32, and then lifted.

Figure 4:
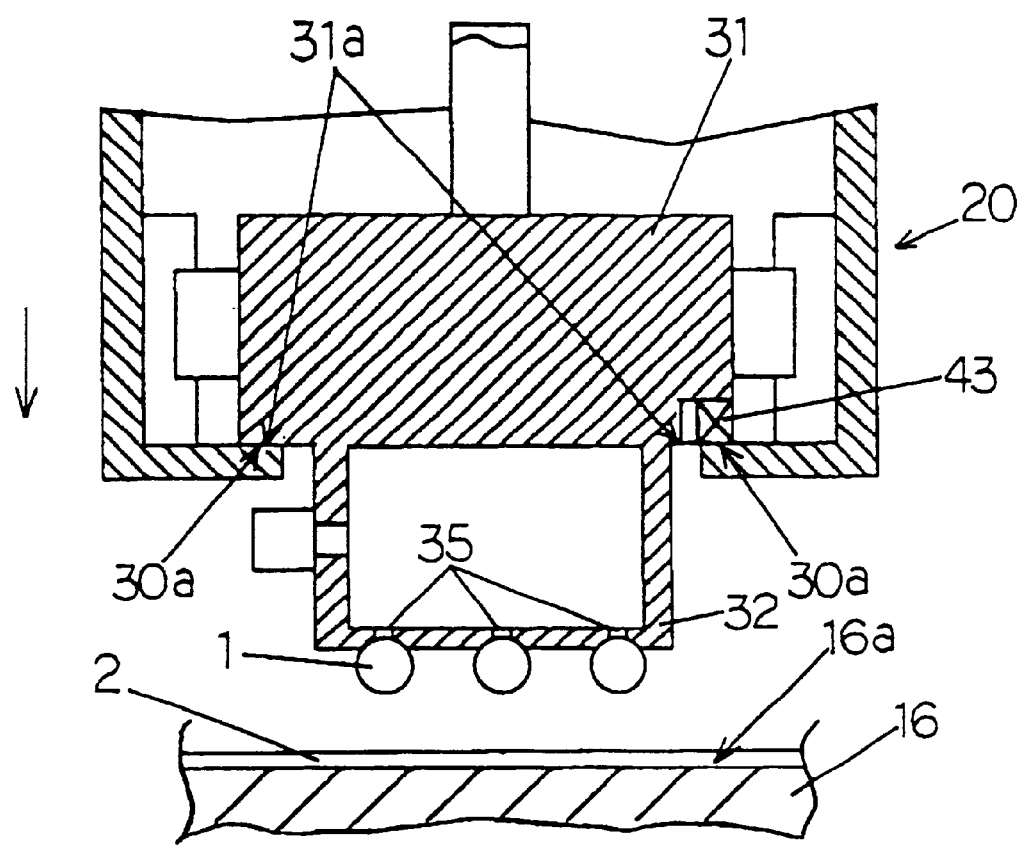
FIG. 4 is a drawing of a suction head in the mounting apparatus of FIG. 1; used to explain an operation before application of adhesive substance onto the balls.
Figure 5:
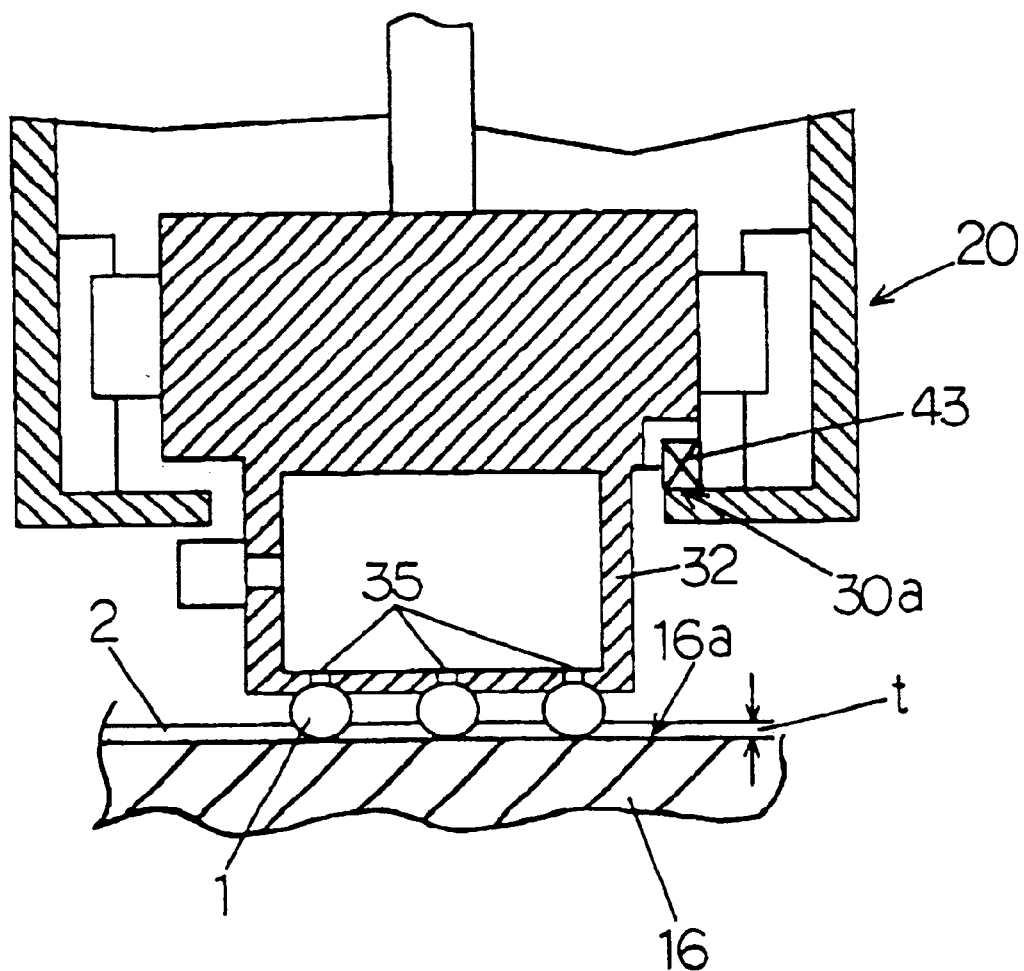
FIG. 5 is a drawing of a suction head in the mounting apparatus of FIG. 1; used to explain an operation of applying adhesive substance onto the balls.
Figure 6:
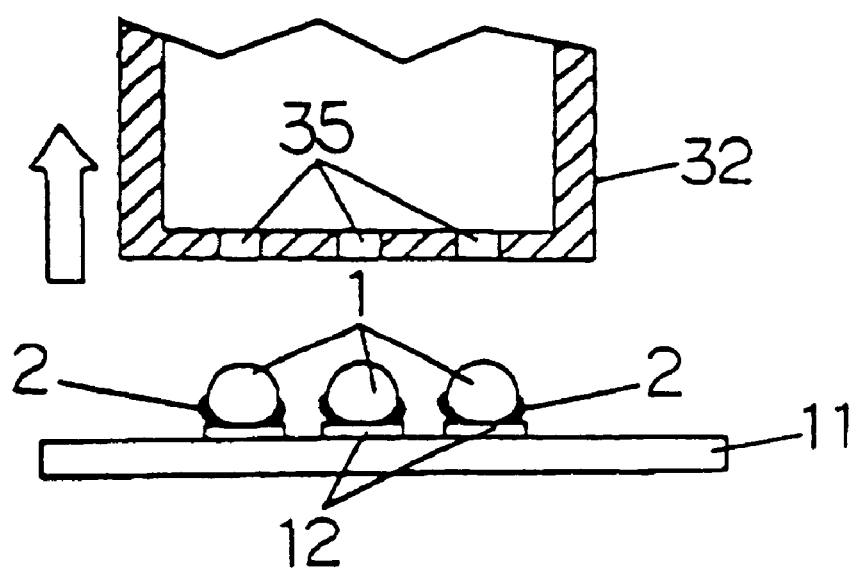
FIG. 6 is a drawing of a suction head in the mounting apparatus of FIG. 1; used to explain an operation of mounting the small balls provided with adhesive substance to a workpiece.

Suction head 20 moves to an area above the container 16 of flux reservoir, and is lowered by motor 56 towards container 16 of flux reservoir, as shown in FIG. 4. The lowering motion continues until the solder ball 1 held to the lower surface of suction tool 32 comes in touch with the bottom 16 a of container 16 and the touching is detected by touch sensor 43. As soon as the touching between solder ball 1 and bottom 16a is detected by the touch sensor 43, the control unit 60 suspends rotation of motor 56 to halt the lowering motion of suction head 20. Up to that moment, the lowering motion continues whole through the lowering stroke without interruption; therefore, the solder ball 1 is plunged surely into the flux 2 provided on the bottom 16a by a depth equivalent to the layer thickness of flux 2. The flux 2 staying on the bottom 16a in the form of the layer of a certain predetermined thickness t is surely transcribed onto the solder ball 1. Thus the solder balls 1 are applied at any time with a certain specific amount of flux 2 with precision.

As the block 31 is being pressed at the bottom end of the sides 31a to a stopper 30a of the main body of elevation member 30, the lower surface of suction tool 32 is kept totally horizontal. Therefore, all the solder balls 1 held by a vacuum to suction holes 35 are plunged into flux 2 for a same depth; so each of the solder balls 1 is applied with flux 2 for an equal quantity.

As a touching of solder ball 1 to bottom 16a is detected by the touch sensor 43, there is no danger for the solder balls 1 to be deformed by a longer-than-necessary lowering stroke of the suction head 20. Too much deformation caused to the solder ball may bring about clogging of suction hole 35 of suction tool 32 by the solder ball 1. This may lead to mounting error to a workpiece.

Then, the suction head 20 goes up, moves to an area above the workpiece 11 to make lowering/lifting operation there. The solder ball 1 is mounted on an electrode 12 of the workpiece 11, by canceling the vacuum in the suction hole 35 while raising the suction head away from the workpiece. After the workpiece 11 is mounted with solder balls 1, the workpiece 11 is transferred along a guide rail 13 to be sent out to a next processing stage. A new workpiece 11 is sent in on the guide rail 13, on which a set of the above described process steps are repeated.

For ensuring a good solderability, a preferred layer thickness t of flux 2 is such that it is not less than the minimum quantity required to be functionable as flux and less than half the diameter of solder ball.

The present invention can be embodied in various forms, without departing from the spirit or the main feature. The aforementioned embodiment is only examples and not to be understood limitedly. For example, in the above described embodiment a solder ball has been used as a preferred example of the small ball, a flux as a preferred example of the adhesive substance. However, the present invention may of course be effective when applying an adhesive substance like solder paste, electro-conductive glue, etc. on a copper ball, gold ball or other conductive balls. Not being limited to conductive balls, the present invention is also effective when applying an adhesive substance on a plurality of small balls, and mounting these on a workpiece. The scope of the present invention is shown by the claims, and not to be restricted by the above explanations. Modifications or changes in the scope of the claims or equivalents thereto are all within the scope of the invention.

What is claimed is:

1. A mounting apparatus for mounting small balls on a workpiece comprising:

a suction head having a plurality of suction holes disposed in a certain specified arrangement, each hole for holding one small ball by a vacuum;

holding means for holding a workpiece;

a flat plane;

layer forming means for forming a layer of an, adhesive substance with a certain predetermined layer thickness on said plane;

transfer means for transferring said suction head relative to said holding means and said plane so as to position said suction head selectively above said holding means and said plane;

lowering/lifting means for lowering and lifting said suction head having said small balls sucked thereto towards said plane on which said layer of adhesive substance is formed; and detection means for detecting a touching of said small ball held by a vacuum to said suction head to said plane during lowering/lifting operation of said suction head.

2. The mounting apparatus of claim 1, wherein the thickness of said layer is not more than half the diameter of said small ball.

3. The mounting apparatus of claim 1, wherein said small ball is a solder ball, and said adhesive substance is a flux.

4. A mounting method for mounting small balls to a workpiece comprising the steps of:

forming a layer of adhesive substance on a flat plane with a certain predetermined layer thickness;

applying said adhesive substance onto said small balls by bringing a suction head holding said small balls relatively close to said layer of adhesive substance;

detecting a touching of said small balls to said flat plane; and moving said suction head responsive to said detecting, away from said plane and transferring said small balls applied with said adhesive substance onto said workpiece.

5. The mounting method recited in claim 4, wherein the thickness of said layer is not more than half the diameter of said small ball.

6. The mounting method recited in claim 4, wherein said small ball is a solder ball, and said adhesive substance is a flux.

* * * * *